United States Patent
Lee et al.

(10) Patent No.: US 6,611,160 B1
(45) Date of Patent: Aug. 26, 2003

(54) CHARGE PUMP HAVING REDUCED SWITCHING NOISE

(75) Inventors: Chang-Hyeon Lee, Irvine, CA (US); Akbar Ali, Garden Grove, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/718,963

(22) Filed: Nov. 21, 2000

(51) Int. Cl.$^7$ ................................................. H03L 7/06
(52) U.S. Cl. ......................................... 327/157; 327/148
(58) Field of Search ............................... 327/148, 156, 327/157, 158, 162

(56) References Cited

U.S. PATENT DOCUMENTS

| | | |
|---|---|---|
| 4,931,749 A | 6/1990 | Walters |
| 5,066,870 A | 11/1991 | Kobatake |
| 5,233,314 A | 8/1993 | McDermott et al. |
| 5,392,205 A | 2/1995 | Zavaleta |
| 5,491,439 A | 2/1996 | Kelkar et al. |
| 5,629,650 A | 5/1997 | Gersbach et al. |
| 5,646,563 A | 7/1997 | Kuo ........................ 327/157 |
| 5,692,164 A | 11/1997 | Pantelakis |
| 5,703,511 A | 12/1997 | Okamoto |
| 5,740,213 A | 4/1998 | Dreyer |
| 5,751,186 A * | 5/1998 | Nakao ........................ 327/562 |
| 5,767,736 A | 6/1998 | Lakshmikumar et al. |
| 5,798,660 A * | 8/1998 | Cheng ......................... 327/563 |
| 5,870,003 A | 2/1999 | Boerstler |
| 5,886,551 A | 3/1999 | Narahara |
| 5,920,233 A | 7/1999 | Denny |
| 5,936,445 A | 8/1999 | Babanezhad et al. ....... 327/157 |
| 6,011,822 A | 1/2000 | Dreyer |
| 6,028,473 A | 2/2000 | Kamei et al. |
| 6,028,780 A | 2/2000 | Chang |
| 6,058,033 A | 5/2000 | Williams et al. |
| 6,064,251 A | 5/2000 | Park |
| 6,067,336 A | 5/2000 | Peng |
| 6,075,406 A | 6/2000 | Lee et al. |
| 6,172,535 B1 * | 1/2001 | Hopkins ........................ 327/65 |
| 6,194,920 B1 * | 2/2001 | Oguri ........................ 327/563 |
| 6,198,320 B1 * | 3/2001 | Boerstler .................... 327/157 |
| 6,229,345 B1 * | 5/2001 | Kirkland et al. .............. 327/65 |
| 6,292,061 B1 * | 9/2001 | Qu .............................. 327/156 |
| 6,320,426 B1 * | 11/2001 | Shih ............................ 327/65 |

OTHER PUBLICATIONS

"Fully–Integrated CMOS Phase–Locked Loop with 15 to 240 MHz Locking Range and ±50ps Jitter," Ilya Novof, John Austin, Russ Chmela, Todd Frank, Ram Kelkar, Ken Short, Don Strayer, Mark Styduhar, Steve Wyatt, *ISSCC95/Session6/Digital Design Elements/Paper TA 6.5.*
"Digital Clocks and Latches," Ian Young, *ISSCC96/Feb. 9, 1996/Sea Cliff/8:30 a.m.*

* cited by examiner

Primary Examiner—Terry D. Cunningham
(74) Attorney, Agent, or Firm—Thomas, Kayden, Horstemeyer & Risley LLP

(57) ABSTRACT

A low power charge pump is provided that has complementary transistors capable of isolating switching noise from the input switching transistors. The charge pump uses charged currents that are matched in both magnitude and time to reduce switching noise in the output of the charge pump. The charge pump is also designed for use in a phase lock loop.

10 Claims, 5 Drawing Sheets

CHARGE PUMP HAVING REDUCED SWITCHING NOISE

BACKGROUND OF THE INVENTION

1. Technical Field

The invention relates generally to charge pump systems, and more particularly, to a charge pump system with reduced switching noise and/or low power requirements.

2. Related Art

Phase locked loop (PLL) circuits are widely used in many different applications. Three applications of PLL circuits are (1) to lock or align the output clock of a circuit with the clock input; (2) to multiply (i.e., increase) or divide (i.e., decrease) the output frequency of a circuit with respect to the input frequency; and (3) to provide clock recovery from signal noise. A phase-locked loop (PLL) circuit provides an output frequency that is adjusted to stay in sync with a reference signal.

A PLL commonly includes a charge pump and a loop filter. The charge pump controls the input voltage to a voltage controlled oscillator (VCO). The input voltage is based on inputs signals. For example, a charge pump may compare two input signals from a phase detector and vary the output voltage when the signals are out of phase. A differential charge pump may have four inputs from the phase detector and two outputs connected with a loop filter. A charge pump with a relatively high operating voltage requires a significant amount of semiconductor die space and consumes more power than a low voltage charge pump.

When a conventional PLL with a differential charge pump is locked, any mismatch in the current sources results in a leakage into the loop filter, generating sideband noise in the output signal. When the conventional charge pump's control signals are switched off, charge injection and clock feedthrough results in undesirable fluctuations in the voltage from the loop filter to the VCO. The fluctuations cause the output frequency from the VCO to undesirably fluctuate.

The VCO output frequency varies based on an input voltage. A VCO typically outputs a sine wave. As the input voltage to the VCO increases, the output frequency from the VCO also increases. The dynamic range of the output voltage of a charge pump is an important factor in determining the maximum range and accuracy of the lock frequencies of the PLL.

Conventional PLLs generate noise, such as spurious sideband tones, phase noise, and switching noise. In a PLL, the noise may be created by a clock source feed through, charge injection at a P-type MOSFET (PMOS) or N-type MOSFET (NMOS) switching transistor, or another source. Also, the switching nodes of conventional charge pumps often have charge sharing resulting from parasitic capacitance.

For example, the differential charge pump described in Novof et al., Fully-Integrated CMOS Phase-Locked Loop with 15 to 240 MHz Locking Range and +/−50 ps Jitter, IEEE International Solid-State Circuits Conference, 1995, pp. 112–113 exhibits charge sharing and clock feed-through.

A charge pump charges and discharges a loop filter based on the phase difference between the inputs to the charge pump. A conventional charge pump provides an output current that is the difference between an up-current from a current source connected with a supply voltage and a down-current from a current source (current sink) connected with ground. A transistor is used to turn-on or off the current source and charges the output node (i.e., increases the output voltage). Another transistor turns-on or off the current sink and discharges the output node (i.e., decreases the output voltage). A loop filter is used to reduce the output voltage fluctuations caused by switching off the up and down currents. The up and down currents should be equal to maintain a constant output voltage.

Traditionally, in a CMOS charge pump, the current source and its transistor are P-channel devices. P-channel transistors handle the supply voltage better than N-channel devices. The current sink and its transistor are N-channel devices because N-channel devices handle the reference voltage better. It is therefore desirable to have a charge pump that operates at lower power level. Further, it is desirable to elimination noise generated by the charge pump.

SUMMARY

This invention is a low power charge pump having complementary transistors that isolate switching noise from the input switching transistors. The charge pump uses charged currents that are matched in both magnitude and time to reduce switching noise in the output of the charge pump. The charge pump is designed for use in a phase lock loop. The charge pump may be operated with a lower supply voltage than traditional charge pumps, thus consuming less power. The charge pump output is isolated from the input switching nodes to minimize the parasitic capacitance created by charge sharing. Thus, the switching noise created by the input switching transistors is greatly reduced.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts throughout the different views.

DETAILED DESCRIPTION OF THE PREFERRED EMBODIMENTS

Advances in portable devices, such as cellular telephones, create a need for charge pumps and phase lock loops that consume less power and provide cleaner signal than conventional charge pumps and phase lock loops. Power consumption of portable devices is a critical component to the operational life of the devices. As such devices operate at higher speeds, the accuracy of the phase lock loop and the charge pump becomes more critical. Therefore, the various embodiments of the charge pumps described below solve these problems by providing devices that operate at lower supply voltage levels and produce cleaner output signals with less switching noise. The charge pumps operate with both magnitude and time matched charged currents. The charge pump and/or the phase lock loop may be fabricated on a semiconductor substrate.

Figure 1:
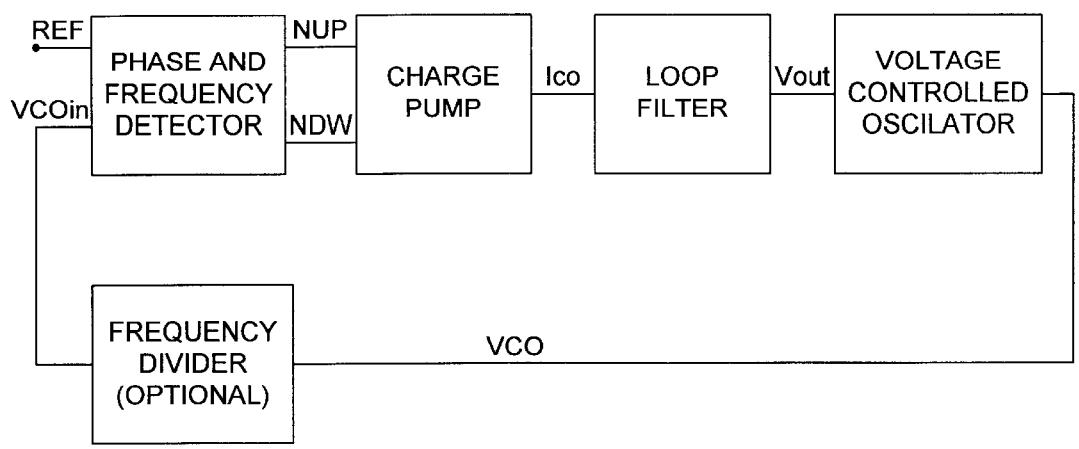
FIG. 1 is a block diagram illustrating an embodiment of a phase lock loop.

FIG. 1 illustrates an example of a phase-locked loop (PLL) 100 that includes a phase and frequency detector 106, a charge pump 108, a loop filter 110, a voltage controlled oscillator (VCO) 112, and a frequency divider 114 (optional). While FIG. 1 illustrates one possible configuration for a PLL with a charge pump, the charge pump may also be used in many other PLL configurations including frequency synthesizers.

The phase and frequency detector 106 receives two signals, a reference signal (Ref) and a VCOin signal and transmits two control signals, not up ("NUP") and not down ("NDW"). The reference signal may be provided by a reference clock source, such as a crystal oscillator and the VCO signal may be provided from the VCO 112 via the 5 optional frequency divider 114. The phase and frequency detector 106 compares the phase or frequency of the two input signals and provides the control signals to the charge pump 108. When the two inputs are in phase, the PLL 100 is locked, and the control signals have identical phases and frequencies.

The charge pump 108 responds to the control signals, NUP and NDW, from the phase and frequency detector 106 and outputs a current, Ico, to the loop filter 110. The loop filter 110 generates a DC voltage by averaging the Ico signal. Various aspects of different embodiments of the charge pump 108 are discussed in reference to FIGS. 2 and 3. While FIG. 1 illustrates a charge pump 108 that is controlled by only two control signals, NUP and NDW, other embodiments of the charge pump 108 have other control signals. For example, a charge pump 108 may have four or more control signals, UP, DW, UP bar (NUP), and DW bar (NDW).

The loop filter 110 transmits a signal, Vout, to the voltage controlled oscillator (VCO) 112. The output voltage from the loop filter 110 is responsive to the input current to the loop filter 110. The loop filter 110 filters out some of the noise in the signal "Ico." The loop filter 110 may comprise a low pass filter (LPF) with a resistor in series with a capacitor and in parallel with another capacitor. The loop filter's 110 characteristics are determined based on the characteristics of the phase lock loop 100. The loop filter 110 provides stability and reduces transients in the PLL 100. While the charge pump 108 and the loop filter 110 are illustrated as separate devices, the term "charge pump" may include a charge pump with an integrated loop filter.

The output current from the charge pump 108 is generated as a function of the differences between matched current sources. A constant output voltage from the loop filter is maintained where the input current sources are equal or matched, providing a constant frequency oscillation signal from the VCO 112. Otherwise, the input signals to the phase and frequency detector 106 are out of phase. The phase and frequency detector 106 changes the duty cycles of the control signals for stable operation. The VCO 112 may include a voltage to current converter ("V2I") and a current controlled oscillator ("ICO").

For example, when the signal VCOin trails the reference signal REF, the duty cycle of control signal UP is increased relative to the duty cycle of control signal DW. The increased duty cycle of the control signal UP increases the output voltage (Vout) from the loop filter 110. The increased output voltage (Vout) causes an increase in the oscillation frequency of output signal (VCO) from the VCO 112. This cycle is repeated until the two inputs, VCOin and REF, are synchronized.

Figure 2:
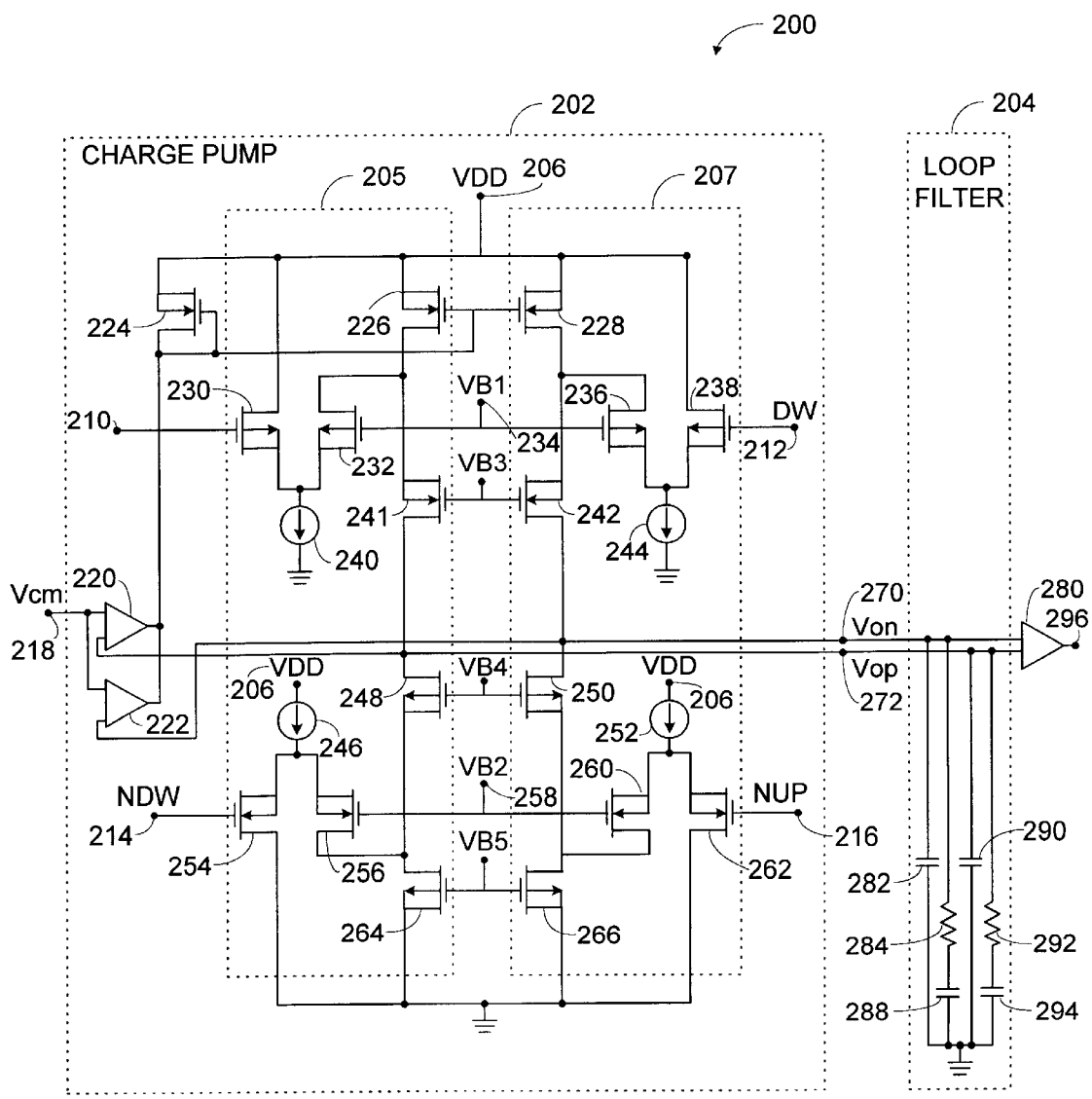
FIG. 2 is a schematic diagram illustrating an embodiment of a differential charge pump.

FIG. 2 is a schematic diagram illustrating an embodiment of a charge pump 200 that includes a charge pump circuit 202 and a loop filter 204. The charge pump circuit 202 has four control signal input nodes 210, 212, 214, and 216 for receiving four control signals UP, DW, UP bar ("NUP"), and DW bar ("NDW"), respectively. The control signals control the charge pump 200 and the output signal (Ico) at output node 296. The NUP signal is the inverse of the UP signal and may be derived using an inverter. Likewise, the NDW signal is the inverse of the DW signal and may be derived using an inverter. The charge pump 202 includes two charge pump circuits 205 and 207

Each of the four control signals controls a switching transistor which are preferably enhancement mode PMOS transistors. The UP signal received at input node 210 controls a switching transistor 230 connected with the current source 240 connected with ground. The current source 240 comprises a current sink. The DW signal received at input node 212 controls a switching transistor 238 connected with another current source 244 (current sink) connected with ground. The NUP signal received at input node 216 controls a switching transistor 262 connected with the current source 252 connected with the supply voltage (VDD) at node 206. The NDW signal received at input node 214 controls a switching transistor 254 connected with another current source 246 connected with the supply voltage (VDD) at node 206. The switching transistors 230, 238, 254, 262 may generate some switching noise transitioning between the OFF and ON states.

The common mode voltage signal (Vcm) is received at the input node 218. The input node 218 is connected with the positive terminals (non-inverting terminals) of two amplifiers 220 and 222. The output terminals of the amplifiers 220 and 222 are interconnected with the common mode feedback circuit 224. The negative terminals (inverting terminals) of the amplifiers 220 and 222 are connected with the differential output signals, Von and Vop. The amplifiers 220 and 222 may have a transconductance gain on the order of 40 dB or more. Other gains, including lesser gains, may be provided.

The input nodes 234 and 258 receive input signals VB1 and VB2, respectively. The input signals VB1 and VB2 may be constant voltage signals with an amplitude less than the supply voltage. For example, VB1 and VB2 may be approximately half the voltage of the supply voltage, VDD. If VDD is 3.0V, then VB1 and VB2 may be approximately 1.5V. The supply voltage for the charge pump illustrated in FIG. 2 may be 3.0V or greater depending on the characteristics of the transistors. Other implementations of the charge pump 200 may use a supply voltage above or below 3.0V.

The input signal VB1 is connected with the gates of two transistors 232 and 236. The transistors 232 and 236 are complementary transistors to the switching transistors 230 and 212, respectively. The complementary transistor 232 is off when the switching transistor 230 is on, and the complementary transistor 232 is on when switching transistor 230 is off. The complementary transistor 232 is controlled indirectly by the UP signal at input node 210. However, the complementary transistor 232 exhibits less switching noise than the switching transistor 230 because the complementary transistor 232 is indirectly controlled. The complementary transistors 232, 236, 256, and 260 may be enhancement mode P-type transistors or other circuits.

The source node of the transistor 232 is connected with the current source 240, and the drain node of the transistor 232 is connected with the drain node of the transistor 226 and the source node of the transistor 241. The source node of the transistor 226 is connected with the supply voltage. Likewise, the source node of the transistor 236 is connected with the current source 244, and the drain node of the transistor 236 is connected with drain node of the transistor 228 and the source node of the transistor 242. The source node of the transistor 228 is connected with the supply voltage. The gate nodes of the transistors 226 and 228 are connected with the output of the operational amplifiers 220 and 222. The gate nodes of the transistors 241 and 242 are interconnected, and further connected to an input voltage VB3. The drain of the transistor 242 is connected with the differential output signal 270, labeled "Von." The drain of the transistor 241 is connected with the differential output signal 272, labeled "Vop." The configuration of the transistors 228 and 242 comprises a cascode configuration. Likewise, the transistors 226 and 241 are in a cascode configuration.

The input signal VB2 is connected with the gates of the complementary transistors 256 and 260. The source node of the complementary transistor 256 is connected with the current source 246, and the drain node of the complementary transistor 256 is connected with the drain node of transistor 264 and the source node of the transistor 248. The source node of transistor 264 is connected with ground. Likewise, the source node of the complementary transistor 260 is connected with the current source 252. The drain node of the complementary transistor 260 is connected with the drain node of the transistor 266 and the source node of the transistor 250. The source node of the transistor 266 is connected with the ground. The gate nodes of the transistors 264 and 266 are interconnected, and further connected to an input voltage VB5. The gate nodes of the transistors 248 and 250 are interconnected, and further connected to an input voltage VB4. The drain of the transistor 250 is connected with the differential output signal "Von" 270. The drain of the transistor 248 is connected with the differential output signal "Vop" 272.

The charge pump 200 may be used in low voltage applications. The minimum supply voltage for the charge pump is controlled in part by the number of transistors in the source to drain configuration between the supply voltage and ground. In the embodiment illustrated in FIG. 2, four transistors are connected in a source to drain configuration between the supply voltage and ground. To provide high power supply noise rejection (PSNR) from any power supply noise, the supply voltage (VDD) of the charge pump is as small as possible. For example, VDD may be of various values, such as between 3.0 and 5.0 volts. A preferred supply is approximately 2.2 volts. Since the output current from the charge pump 200 is a function of the loop bandwidth and the damping factor of the PLL, the charge pump 200 has desirable stable temperature characteristics.

An optional common mode feedback circuit 224 increases the dynamic range of the control signals. In the embodiment illustrated in FIG. 2, the common-mode feedback circuit 224 includes an enhancement mode P-type MOSFET transistor ("PMOS"). Other common-mode feedback circuits may also be used. The common-mode feedback circuit's 224 gate node connects with the drain node. The drain node is also connected with the output of the operational amplifiers 220 and 222. The source node of the common mode feedback circuit 224 is connected with the supply voltage (VDD). Other common mode feedback circuits may also be used.

The loop filter 204 may include two low pass filter circuits and is connected with a transconductance amplifier 280 that converts voltage to current. Further, the loop filter 110 may be a differential loop filter that includes a filter for each of the differential signals and an optional gain amplifier that compares the differential signals to create a single signal. More or fewer filter circuits may be used.

The loop filter 204 receives two differential signals from the charge pump circuit 202 and transmits a signal (Ico) at an output node 296. As illustrated in FIG. 2, the loop filter 204 includes two second order low pass filters. A first filter is used for the first differential signal, Von, and a second filter is used for the second differential signal, Vop. The differential signals, Von and Vop, are connected with the non-inverting and inverting input terminals of the transconductance amplifier 280.

The first low pass filter includes a capacitor 282 in parallel with series connected resistor 284 and capacitor 288. The second low pass filter includes a capacitor 290 in parallel with series connected resistor 292 and capacitor 294. In one embodiment, the first and second low pass filters have substantially similar characteristics. The capacitors 282 and 290 smooth the voltage developed across the resistors 284 and 292, respectively, when the charge pump circuit 202 is switched from the ON to the OFF state or vice versa. The capacitors 282 and 290 have a small capacitance relative to the capacitors 288 and 294, respectively. For example, the capacitor 282 may have a value of 25 pF; the resistor may have a value of 10 Kohms; and the capacitor 288 may have a value of 250 pF. In alternative embodiment, the resistors 282 and 292 may be between 100 Ohms and 100 Kohms, the capacitors 288 and 294 may be between 100 pF and 500 pF, and the capacitors 282 and 290 may be between 10 pF and 50 pF.

The output voltage from the loop filter 204 at the output node 296 is substantially equal to the voltage at the input node 218 (Vcm) shortly after the PLL 100 (FIG. 1) reaches the locked state. The input signal Vcm is received from a bandgap voltage reference circuit and is preferably a substantially constant voltage approximately half of the supply voltage. Such an output voltage is preferred when the center frequency of the VCO 112 (FIG. 1) is substantially equal to the expected clock output of the PLL 100.

While the embodiment illustrated in FIG. 2 uses N and P type MOSFET transistors, other types of transistors and other circuits may also be used to implement the design. It is preferred that the NMOS and PMOS transistors be enhancement mode devices. Likewise, many implementations of the loop filter 204 may be used. Further, two inverters may be used to generate the input signals NUP and NDW from the input signals UP and DW, respectively, within the charge pump circuit 202.

Figure 3:
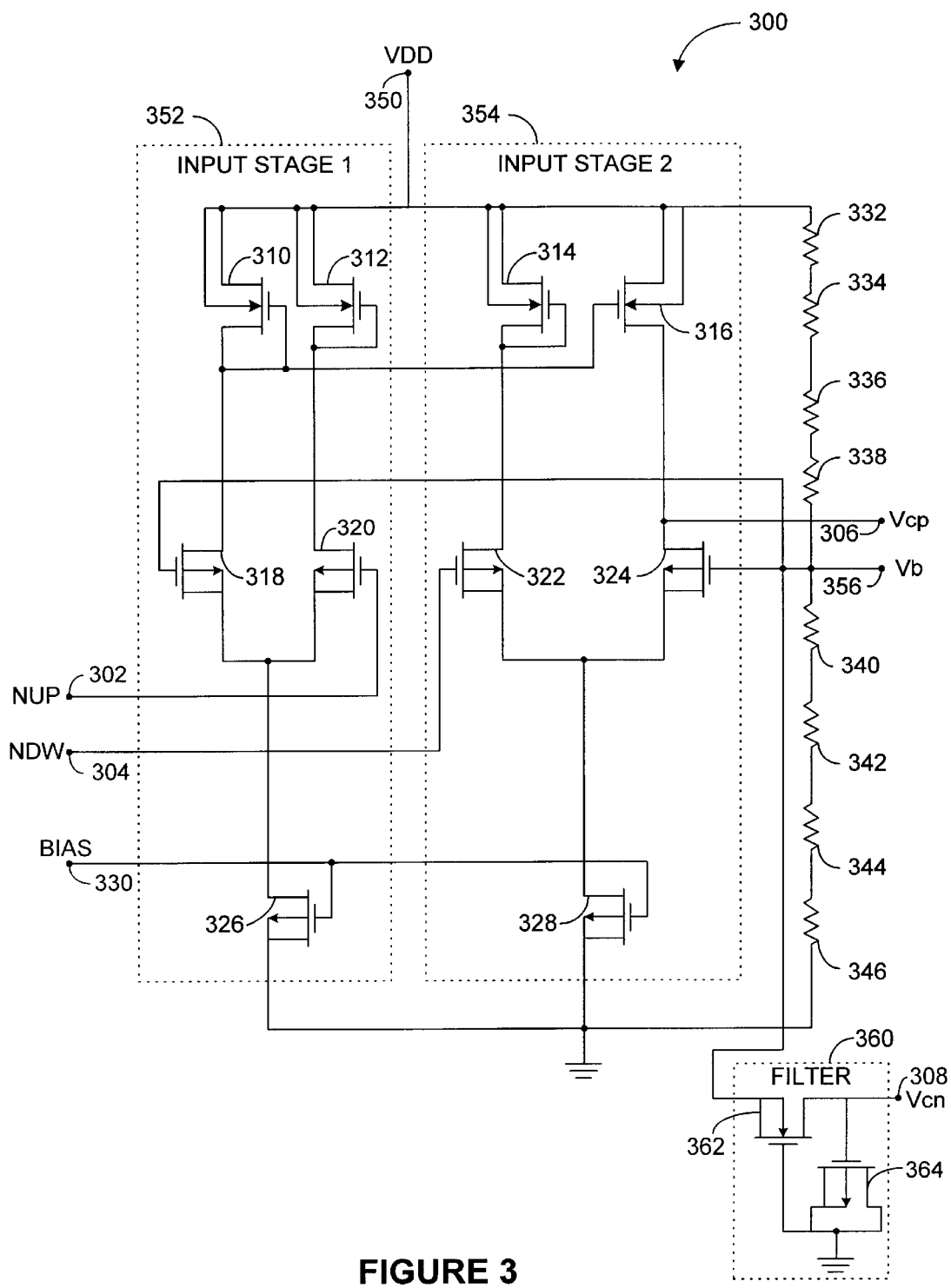
FIG. 3 is a schematic diagram illustrating an embodiment of a charge pump.

FIG. 3 is a schematic diagram illustrating another embodiment of a charge pump 300. The charge pump 300 may be used in low voltage applications. To improve the power supply noise rejection (PSNR) from the power supply noise, the supply voltage (VDD) 350 to the charge pump 300 is less than conventional charge pumps. For example, VDD may be between 3.3V and 1.0V. In one embodiment, the supply voltage may be approximately 2.2V to 1.8V.

The charge pump 300 uses two differential inputs at input nodes 302 and 304. The input nodes 302 and 304 receive input signals NUP and NDW, respectively. These input signals are as described above with respect to FIG. 2. The input nodes 302 and 304 control the input stages 352 and 354, respectively.

The charge pump 300 prevents switch coupling to the loop filter by having constant voltage sources at the input stages. In order to reduce the size of the charge pump 300, the conventional two differential loop filters may be replaced with a constant voltage source and a loop filter. The resulting loop filter operates similarly to a differential loop filter.

The input stage 352 includes transistors 310, 312, 318, 320, and 326. The input node 302 is connected with the gate of the switching or input transistor 320. The source of the switching transistor 320 is connected with the drain of a charging transistor 312. The gate and the drain of the charging transistor 312 are connected. The source of the charging transistor 312 is connected with the supply voltage. The drain of the switching transistor 320 is connected with the source of the current sink transistor 326. The drain of the current sink transistor 326 connected with ground. The gate of the current sink transistor 326 is connected with a Bias signal at an input node 330. The Bias signal is provided by a bandgap circuit and is a reference current. The drain of the charging transistor 310 is connected with the supply voltage, and the gate and source of the charging transistor 310 are interconnected. The drain of the complementary transistor 318 is connected with the source of the charging transistor 310 in a cascode configuration. The complementary transistor 318 turns-on when transistor 320 turns-off and vice versa. The source of the complementary transistor 318 is connected with the drain of the transistor 326 in a cascode configuration. The gate of the complementary transistor 318 is connected with a voltage divider circuit that includes several series connected resistors 332–346. The gate voltage of the complementary transistor 318 is maintained at approximately half of the supply voltage as a function of the resistors 332–346. The signal, Vb, at node 356 is determined by the voltage divider and is preferably approximately half of the supply voltage. The signal, Vb, is connected with the gate of the complementary transistors 318 and 324. Thus, the output signal is isolated from the switching noise at the switching transistor 320.

The input stage 354 includes several transistors 314, 316, 322, 324, and 328. The input node 304 is connected with the gate of the switching or input transistor 322. The switching transistor 322 receives the input signal "NDW." The drain of the switching transistor 322 is connected with the source of the charging transistor 314 in a cascode configuration. The gate and source of the charging transistor 314 are interconnected, and the drain of charging transistor 314 is connected with the supply voltage. The source of the switching transistor 322 is connected with the drain of the sink transistor 328. The source of the sink transistor 328 connected with ground. The gate of the sink transistor 328 is connected with the Bias signal at input node 330. The drain of the charging transistor 316 is connected with the supply voltage 350. The gate of the charging transistor 316 is connected with the source of the charging transistor 310. The source of the charging transistor 316 is connected with the drain of the complementary transistor 324 in a cascode configuration. The complementary transistor 324 turns-on when the switching transistor 322 turns-off and vice versa. The sources of the transistors 322 and 324 are connected with the drain of the sink transistor 328. The gate of the complementary transistor 324 is connected with the voltage divider that includes resistors 332–346, such that the gate voltage of the complementary transistor 324 is approximately half of the supply voltage.

The switching transistors 318, 320, 322, and 324 may be enhancement mode PMOS transistors or similar circuits. The current sink transistors 326 and 328 may also be enhancement mode PMOS transistors or similar circuits. The charging transistors 310, 312, 314 and 316 may be enhancement mode NMOS transistors or similar circuits.

The voltage divider circuit provides a biasing voltage to the gates of the complementary transistors 318 and 324. The biasing voltage (Vb) may be approximately half the supply voltage, however, other voltages may also be used. The voltage divider circuit may include the several resistors 332–346. The voltage divider circuit illustrated in FIG. 3 shows four resistors 332, 334, 336, and 338 between the supply voltage and the biasing voltage and another four resistors 340, 342, 344, and 336 between the biasing voltage and ground. The resistors 332–346 may be interdigitized to conserve space. For example, the resistor 332 may be interdigitized with the resistor 340, the resistor 334 may be interdigitized with the resistor 342, the resistor 336 may be interdigitized with the resistor 344, and the resistor 338 may be interdigitized with the resistor 346. The resistors that are interdigitized preferably have equal resistance. Two or more resistors may be used for each half of the resistor chain to provide for better resistance matching. The resistors 332, 334, 336, and 338 may be substantially balanced with the resistors 340, 342, 344, and 346, such that the voltage between resistors 338 and 340 is approximately half the supply voltage. In an embodiment, the voltage divider circuit can include multiple voltage dividers. Such voltage dividers can provide multiple reference voltages. The reference voltages may be between the minimum and maximum voltage levels (voltage range) of the input signals. A reference voltage of substantially half the range of the input signal is preferred.

The filter 360 is an RC filter that may include two transistors 362 and 364. The filter 360 reduces high frequency noise from the bias signal (Vb), including switching noise, and provides a constant bias when the stages are switched. The voltage into the filter 360 may contain noise caused by the charge pump's inputs, UP and DW, being switched. It is important to have a clean output signal Vcn at node 308 because the signal is being sent to a voltage-to-current converter. In one embodiment, the filter 360 has a capacitance of less than 50 pF but other values may be used. Transistors may be used to form the filter 360 in order to reduce the size of the charge pump 300. In one embodiment, the RC filter 360 has a resistance of about 300 KOhms and a capacitance of about 30 pf. Other resistance and capacitance values for the RC filter 360 are possible and may be based on the performance requirements of the phase lock loop.

The following example illustrates the effects of noise at the output of the charge pump. If the input signal to the RC filter 360 contains 2 mV of noise, the noise may be converted by the VCO to a frequency variance of 600 KHz if the VCO has a gain of 300 MHz/V, as illustrated in Eqn. 1.

Frequency variance=voltage noise*gain       Eqn. 1

This results in phase and frequency shifts from the desired signal. Such phase shift contributes to timing jitter. The output nodes of the charge pump are desirably as quiet as possible to avoid introducing switching coupling noise.

The embodiment of the RC filter 360 illustrated in FIG. 3 shows the source node of the transistor 362 connected with the input signal of the RC filter 360. The gate of transistor 362 is connected with ground. In this configuration, the transistor 362 behaves substantially as a resistor. The drain of the transistor 362 is connected with the gate of the transistor 364 and the output node 308 (Vcn). The source and the drain of the transistor 364 are connected with ground. In this configuration, the transistor 364 behaves substantially as a capacitor. The transistors 362 and 364 form a circuit substantially equivalent to an RC circuit. Transistors may be used instead of resistors and capacitors to save space.

The output nodes from the charge pump 300 include nodes 306 (Vcp), 356 (Vb), and 308 (Vcn). The output nodes 306 (Vcp) and 308 (Vcn) may be connected with input nodes Vcp and Vcn of a voltage-to-current converter. The output nodes 308 (Vcn) may be connected with a input node of a loop filter.

The charge pump 300 may be operated with a lower supply voltage than conventional charge pumps because the path between the supply voltage, VDD, and ground has three or fewer transistors. The supply voltage may be only slightly higher than the voltage drop across the transistors' source and drain nodes (Vsd).

Figure 4:
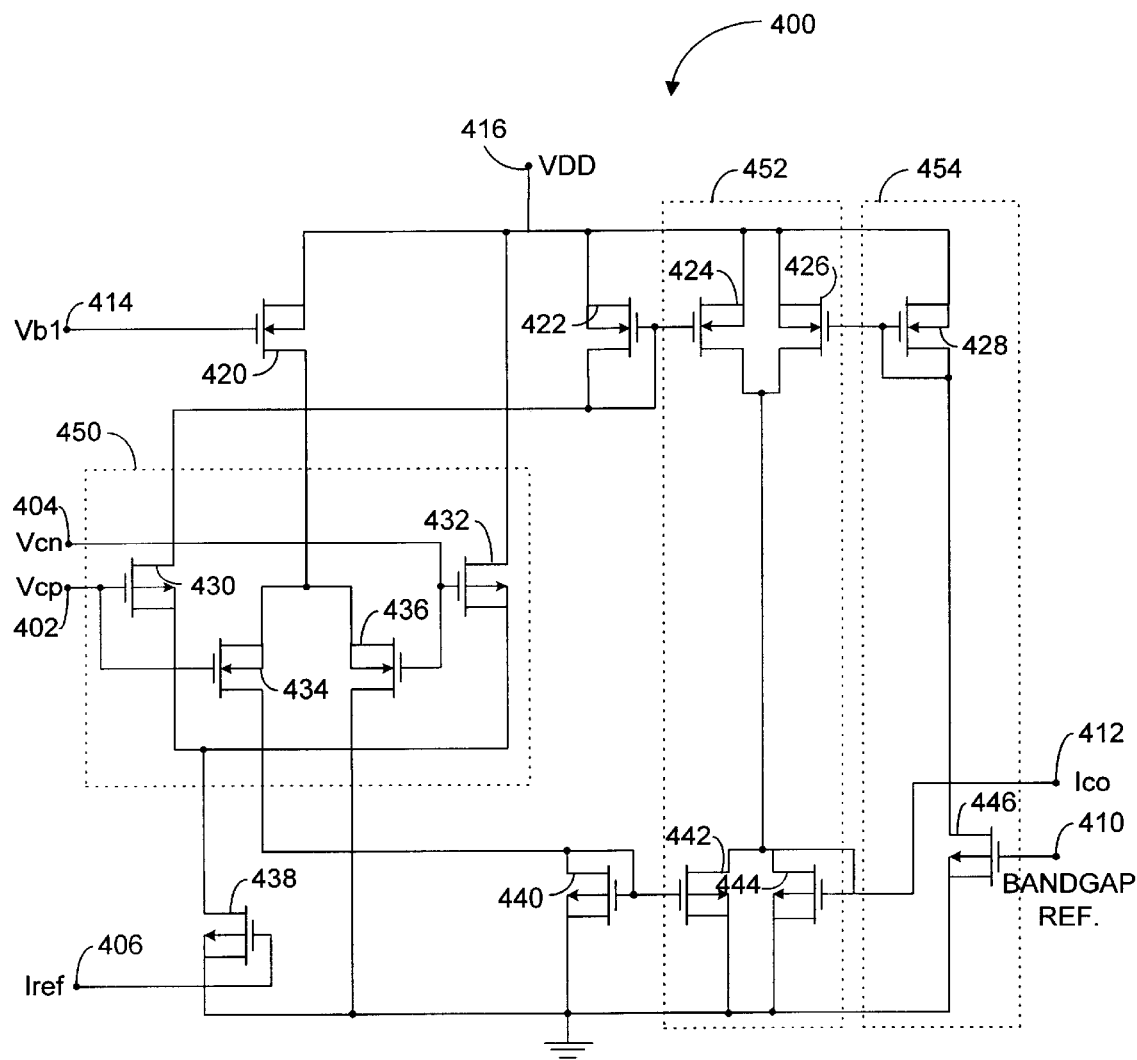
FIG. 4 is a schematic diagram illustrating an embodiment of a voltage-to-current converter.

FIG. 4 illustrates a differential voltage-to-current converter 400 (V2I converter). The V2I converter 400 receives a pair of differential signals, Vcp and Vcn, at input nodes 402 and 404, respectively and generates an output current, Ico, at an output node 412. The input node 414 receives a biasing signal, Vb1. For example, Vb1 is about half the supply voltage but other voltages may be used. The biasing signal, Vb1, activates the transistor 420 to generate current bias for the transistors 434 and 436. In one embodiment, the supply voltage 416, VDD, is approximately 2.2V. Other supply voltages may be used, for example, 5V to 1.5V. It is preferred that the V2I converter 400 operate at low power, thus consuming less power. The input node 410 receives a bandgap reference signal from a bandgap circuit. In one embodiment, the bandgap reference signal is approximately 1.23 to 1.25 Volts but other voltages may be used. The input node 406 receives a reference current signal Iref.

The input stage 450 includes four transistors 430, 432, 434, and 436. The input stage 450 may be used to compensate for the V2I converter being operated at low voltage. The input stage 450 operates rail to rail, that is the voltage range is from nearly the supply voltage to nearly ground. The transconductance of the input stage provides sufficient linearity with transistors and without resistors. The input transistors 430 and 432 occupy relatively less space than conventional input transistors and resistors to a voltage-to-current converter.

When the voltage difference from the input signals Vcp and Vcn from the loop filter is substantially zero, the transistors 426, 428, and 446 provide substantially constant current sources for the center frequency of the PLL output when the PLL is locked. This results in an increased dynamic range of the V2I converter 400. Further, the PLL using the V2I converter 400 does not have a dominant pole to degrade the PLL's stability.

The first output stage 452 includes current source transistors 424 and 426 and current sink transistors 442 and 444. The second output stage 454 include a current source transistor 428 and a transistor 446. The transistor 446 is receives a bandgap reference signal at node 410.

The charge pump 300 (FIG. 3) and the voltage to current converter 400 (FIG. 4) may be used in a phase lock loop where a phase and frequency detector receives a reference signal and frequency feedback signal. The phase and frequency detector generates control signals, e.g. NUP and NDW, and transmits the control signals to the charge pump 300. The charge pump 300 generates differential output signals, e.g. Vcp and Vcn. A loop filter may be connected with the Vcp signal or both signals. The Vcp and Vcn signals are received by the voltage to current converter 400. The converter 400 generates an output signal Iout. A current controlled oscillator ("ICO") receives Iout and generates an output frequency feedback signal, Fvco. The output frequency feedback signal may be received by an optional frequency divider or may be received directly by the phase and frequency detector as VCOin. Other circuits may also utilize the charge pump 300 or the voltage to current converter 400. The voltage to current converter 400 and the current controlled oscillator in combination may be referred to as a voltage controlled oscillator.

Figure 5:
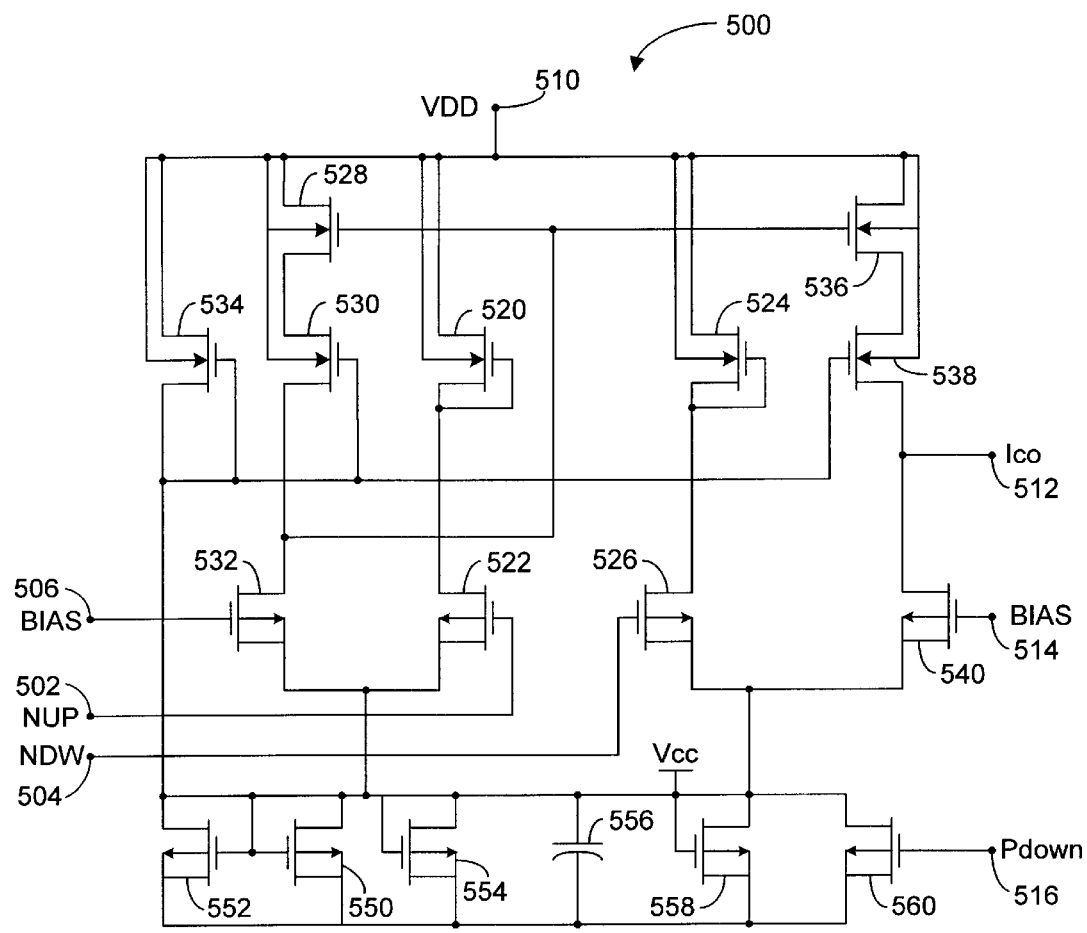
FIG. 5 is a schematic diagram illustrating an embodiment of a charge pump.

In FIG. 5, a low power charge pump 500 with reduced switching noise is shown. The charge pump 500 may receive the control signals NUP and NDW from a phase and frequency detector (PFD) in a PLL. Bias signals are received at input nodes 506 and 514. In an embodiment, the bias signals are approximately half the supply voltage, VDD, at the nodes 506 and 514. The charge pump 500 may be powered down via the power down ("Pdown") signal at input node 516. The charge pump 500 outputs a current signal, Ico, at an output node 512 in response to the control signals, NUP and NDW.

The control signals, NUP and NDW, are received at the gate nodes of switching transistors 522 and 526, respectively. The switching transistors 522 and 526 each have a complementary transistor 532 and 540, respectively. The complementary transistors 532 and 540 switch on and off in a complementary manner to their respective switching transistor 522 and 526. Each of the complementary transistors 532 and 540 are connected with the supply voltage, VDD, via a pair of transistors connected in a cascode configuration. The transistors 528 and 530 connect the complementary transistor 532 to the supply voltage, and the transistors 536 and 538 connect the complementary transistor 540 to the supply voltage. The source transistors 520 and 524 act as current sources when the switching transistors 522 and 526, respectively, are switched on. Sink transistors 554 and 558 act as current sinks when the switching transistors 522 and 526, respectively, are switched on. A common-mode feed back circuit may include a transistor 534 connected with the gates of transistors 530 and 538. While FIGS. 2–5 illustrate embodiments that use NMOS and PMOS transistors, NPN and PNP transistors or other equivalent circuits may also be used. The devices, including charge pumps, loop filters, and voltage-to-current converters, described above may be suitable for use in portable devices, such as cellular telephones, computers, Bluetooth communication devices, and other electronic devices. While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A differential charge pump for use in a phase lock loop, comprising:
    a first charge pump comprising:
        a first switching transistor operable to receive a first input signal, and a first complementary transistor, operating complementary to said first switching transistor and being coupled to said first switching transistor and a first bias voltage;
        a second switching transistor operable to receive a second inverted signal substantially the same as a second signal inverted, and a second complementary transistor, operating complementary to said second switching transistor and being coupled to said second switching transistor and a second bias voltage;

a first cascode transistor pair coupled to said first complementary transistor, and a first input voltage;

a second cascode transistor pair coupled to said second complementary transistor, said first cascode transistor pair and to a third bias voltage and a second input voltage;

a first and second current source having an input coupled to said first and second switching transistors, respectively, and said first and second complementary transistors, respectively, and an output coupled to ground;

a second charge pump comprising:

a third switching transistor operable to receive a second input signal, and a third complementary transistor, operating complementary to said third switching transistor and being coupled to said third switching transistor and the first bias voltage;

a fourth switching transistor operable to receive a first inverted signal substantially the same as the first signal inverted, and a fourth complementary transistor, operating complementary to said fourth switching transistor and being coupled to said fourth switching transistor and the second bias voltage;

a third cascode transistor pair coupled to said third complementary transistor and the first input voltage;

a fourth cascode transistor pair coupled to said fourth complementary transistor, said third cascode transistor pair, and to the third bias voltage and the second input voltage;

a third and fourth current source having an output coupled to said third and fourth switching transistors, respectively, and said third and fourth complementary transistors, respectively, and an input coupled to a supply voltage;

a first output signal being defined between the first and second cascode transistor pairs; and a second output signal being defined between the third and fourth cascode transistor pairs, the first and second output signals forming a differential signal pair.

2. The differential charge pump of claim 1, further comprising a first low pass filter and a second low pass filter coupled to the first and second output signals, respectively.

3. The differential charge pump of claim 2, wherein the first low pass filter comprises a first capacitor and a resistor in parallel with a second capacitor.

4. The differential charge pump of claim 2, wherein the first cascode transistor pair is connected between the supply voltage and the second output terminal; and the second cascode transistor pair is connected between the first output terminal and ground.

5. The differential charge pump of claim 4, wherein the third cascode transistor pair is connected between the supply voltage and the second output terminal; and the fourth cascode transistor is connected between the second output terminal and ground.

6. The differential charge pump of claim 2, further comprising a common mode feedback circuit connected with a gate of one of the transistors in each of the first and second cascode transistor pairs.

7. The differential charge pump of claim 6, wherein the supply voltage is less than 2.5 volts.

8. The differential charge pump of claim 7, wherein the supply voltage is less than 1.9 volts.

9. The differential charge pump of claim 7, wherein the differential charge pump is fabricated on a substrate.

10. The differential charge pump of claim 1, wherein the first and second bias voltages are substantially matched.

* * * * *